United States Patent [19]

Ogikubo et al.

[11] Patent Number: 5,170,121
[45] Date of Patent: Dec. 8, 1992

[54] MAGNETIC RESONANCE DIAGNOSING APPARATUS

[75] Inventors: Yasuyuki Ogikubo; Fumitoshi Kojima, both of Ootawara, Japan

[73] Assignee: Kabushiki Kaisha Toshiba, Tokyo, Japan

[21] Appl. No.: 679,206

[22] Filed: Apr. 2, 1991

[30] Foreign Application Priority Data

Apr. 6, 1990 [JP] Japan ................................ 2-91482

[51] Int. Cl.⁵ ........................................... G01R 33/20
[52] U.S. Cl. ..................................... 324/307; 324/309
[58] Field of Search ............... 324/300, 307, 309, 318, 324/322, 312; 128/653 A, 653 SC

[56] References Cited

U.S. PATENT DOCUMENTS

| 3,873,909 | 3/1975 | Ernst | 324/312 |
| 4,684,893 | 8/1987 | Kojima | 324/312 |
| 4,701,707 | 10/1987 | Riedl | 324/309 |
| 5,079,503 | 1/1992 | Siebold et al. | 324/309 |

Primary Examiner—Michael J. Tokar
Attorney, Agent, or Firm—Foley & Lardner

[57] ABSTRACT

A magnetic resonance diagnosing apparatus has a static magnetic field magnet, a gradient magnetic field coil, a transmitter/receiver probe, a Fourier transformer, a discriminator, a DC offset changer, and a controller. The Fourier transformer transforms a time-region magnetic resonance signal acquired by the transmitter/receiver probe to a frequency-region signal in accordance with Fourier transformation. The discriminator discriminates whether the line width of the frequency-region magnetic resonance signal is not more than a predetermined value. Based on the line width of the frequency-region magnetic resonance signal, the direct current offset changer adjusts the current to be supplied at least to the gradient magnetic field coil so as to correct the offset of the static magnetic field.

35 Claims, 14 Drawing Sheets

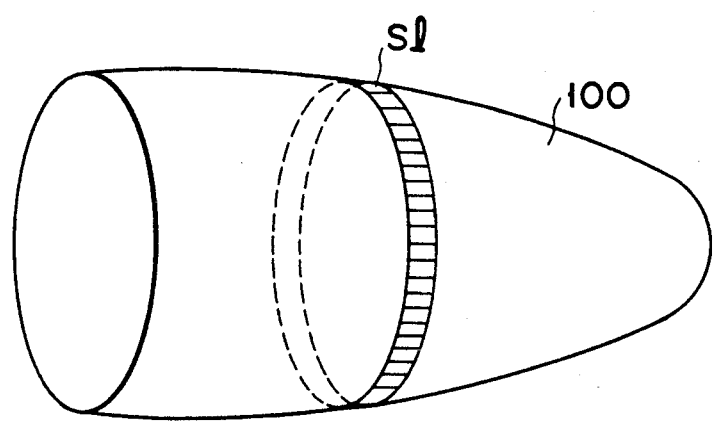
F I G. 2

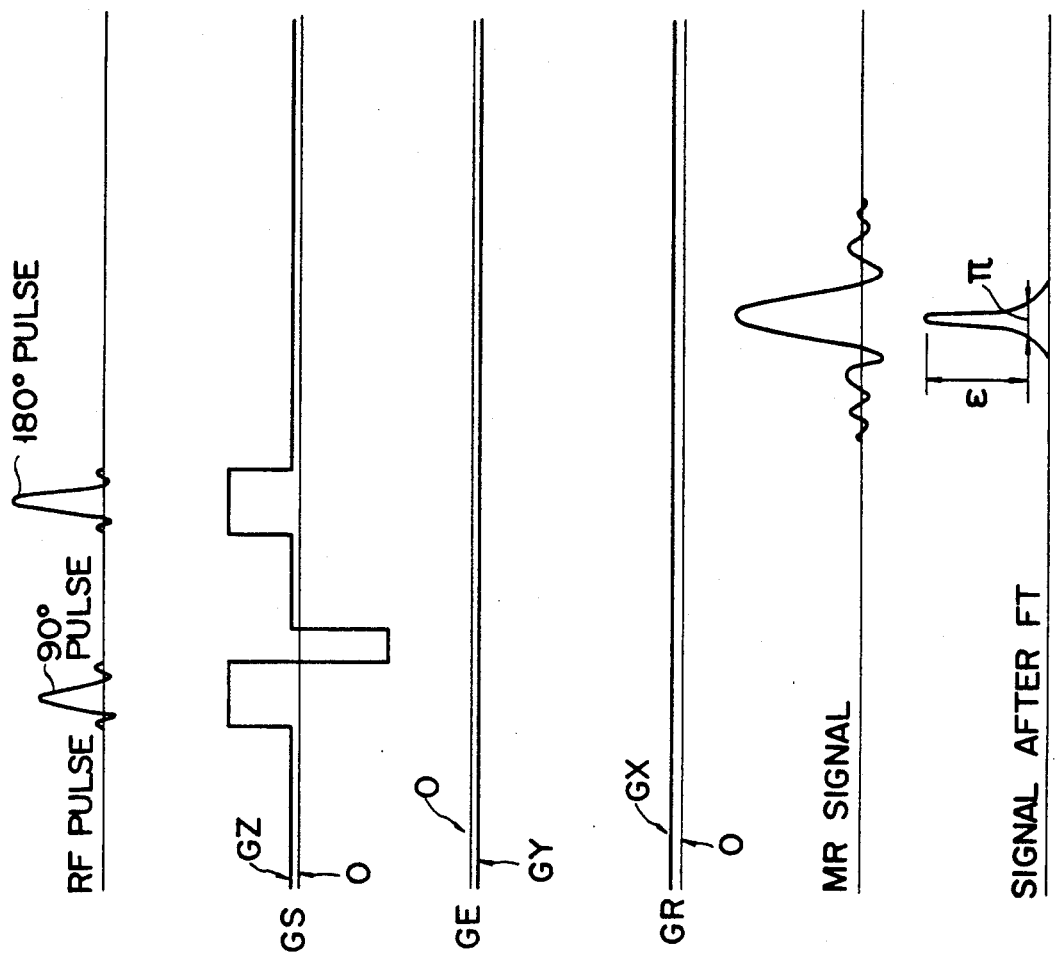
F I G. 3

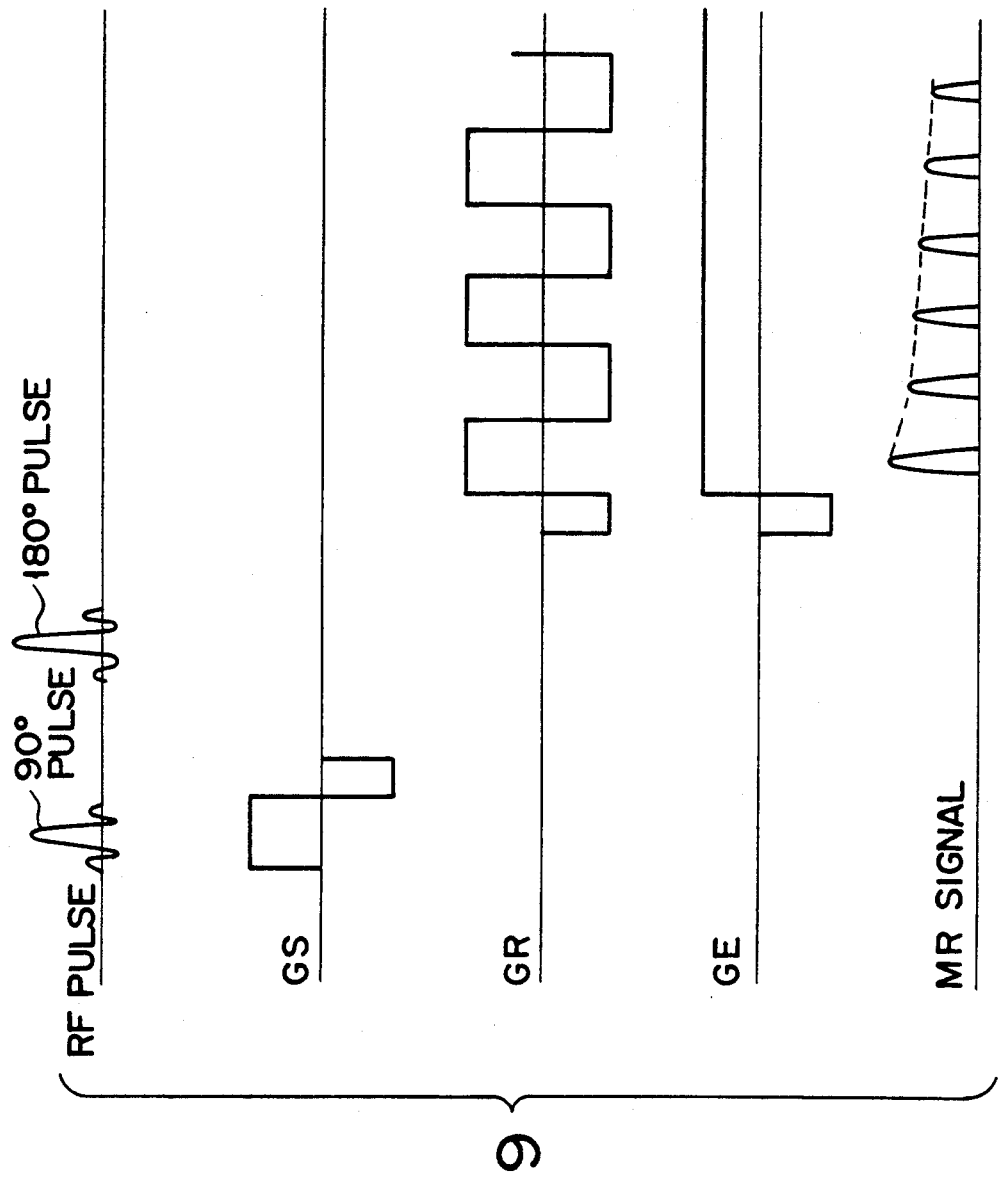
F I G. 9

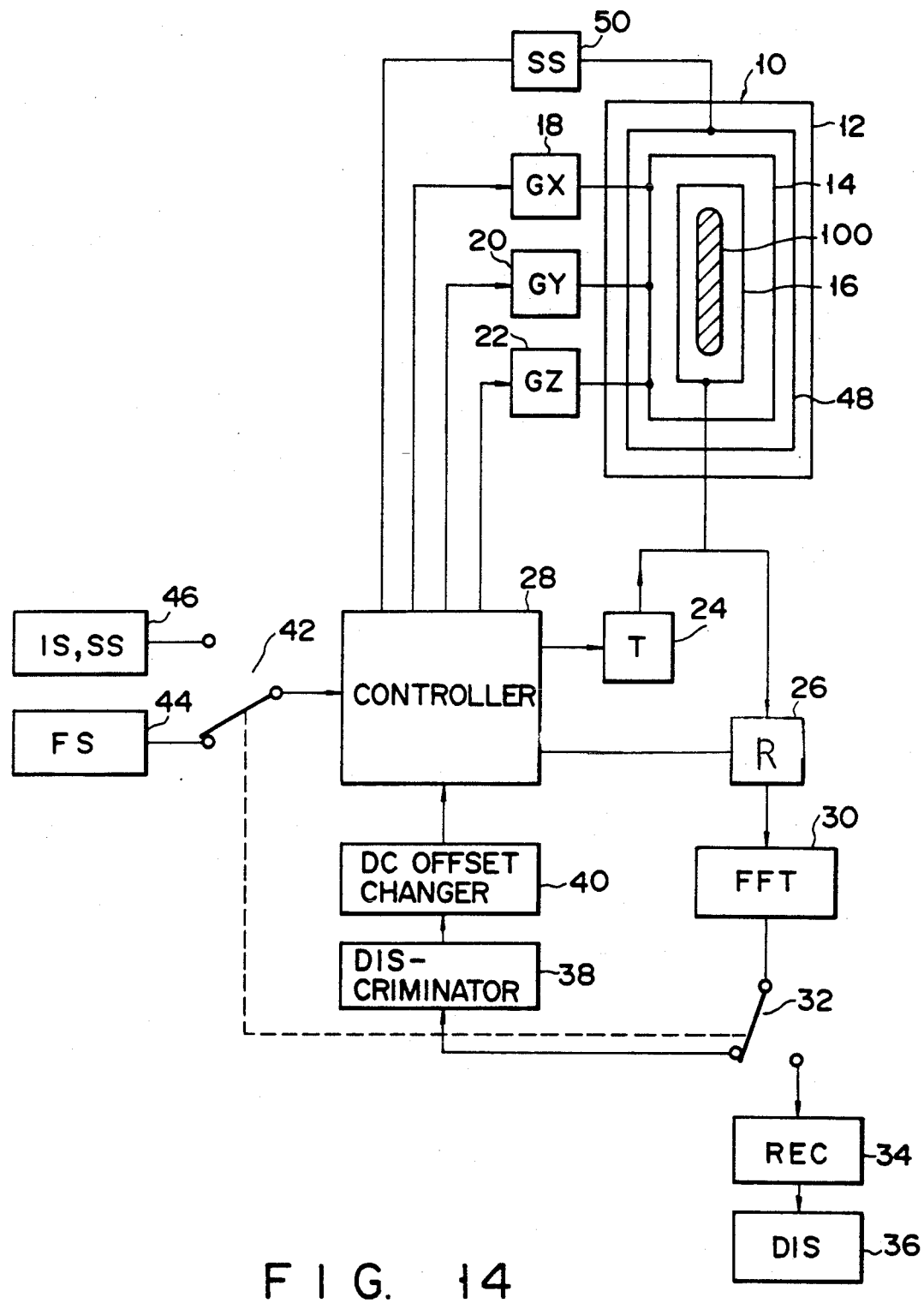
F I G. 14

MAGNETIC RESONANCE DIAGNOSING APPARATUS

BACKGROUND OF THE INVENTION

1. Field of the Invention

The present invention relates to a magnetic resonance diagnosing apparatus for obtaining morphologic data such as a slice image and function data such as spectroscopy of a patient (living body) by utilizing a magnetic resonance (MR) phenomenon.

2. Description of the Related Art

Diagnosis data obtained by a magnetic resonance diagnosing apparatus is morphologic data and function data. Morphologic data is a scano-image, a slice image, or a three-dimensional image of a desired portion of a patient. Function data is spectroscopy or a spectroscopic image The former reflects the density distribution, and the like, of a specific atomic nucleus, e.g., proton. The latter is analytic data of a plurality of chemical compounds including a specific atomic nucleus. In general, morphologic data is called magnetic resonance imaging (MRI), and function data is called magnetic resonance spectroscopy (MRS). Spectroscopic imaging is particularly called MRSI.

The data precision of MRI or MRS is determined depending on the characteristics of a static magnetic field as a basic magnetic field condition to cause an MR phenomenon, the characteristics of an RF pulse used to determine, e.g., the position where the MR phenomenon is to be caused, the characteristics of a gradient magnetic field which adds position data to an MR signal, and the like. Various techniques have been proposed to improve these characteristics. Some techniques have been realized and put into practice as they are incorporated in magnetic resonance diagnosing apparatuses. A typical technique of this type is the one for improving the uniformity of the static magnetic field. According to this technique, a shim coil is provided in addition to a static magnetic field coil (main coil). A correction current is supplied to the shim coil in order to correct the magnetic field generated by the main coil.

However, these techniques including the above-mentioned one for improving the uniformity of the static magnetic field are correction techniques by means of calculation. The data precision using these techniques is thus limited. In addition, it is impossible to perform correction that can cope with changes over time or individual patient's difference. Moreover, in the case of MRS that requires high uniformity in the static magnetic field, a sufficient effect cannot be obtained with these techniques.

SUMMARY OF THE INVENTION

It is, therefore, an object of the present invention to provide a magnetic resonance diagnosing apparatus capable of performing high-precision MRI or MRS by achieving a uniform static magnetic field with a high precision.

This object is achieved by a magnetic resonance diagnosing apparatus comprising:

a magnet system including static magnetic field generating means, gradient magnetic field generating means, exciting RF pulse generating means, and magnetic resonance signal detecting means;

control means for controlling the static magnetic field generating means, the gradient magnetic field generating means, the exciting RF pulse generating means, and the magnetic resonance signal detecting means of the magnet system to obtain magnetic resonance diagnosis data;

transforming means for transforming a magnetic resonance signal obtained by the magnetic resonance signal detecting means from a time-region signal to a frequency-region signal; and offset control means for fixing a current supplied to the gradient magnetic field generating means when a line width of the frequency-region magnetic resonance signal obtained by the transforming mean is a predetermined value or less, and changing the current supplied to the gradient magnetic field generating means when the line width of the frequency-region magnetic resonance signal is more than the predetermined value.

The present invention is also realized by a magnetic resonance diagnosing apparatus comprising:

a magnet system including static magnetic field generating means, gradient magnetic field generating means, exciting RF pulse generating means, magnetic resonance signal detecting means, and a magnetic field correction shim coil;

control means for controlling the static magnetic field generating means, the gradient magnetic field generating means, the exciting RF pulse generating means, the magnetic resonance signal detecting means, and the magnetic field correction shim coil of the magnet system to obtain magnetic resonance diagnosis data;

transforming means for transforming a magnetic resonance signal obtained by the magnetic resonance signal detecting means from a time-region signal to a frequency-region signal; and offset control means for fixing a current supplied to the gradient magnetic field generating means and/or the magnetic field correction shim coil when a line width of the frequency-region magnetic resonance signal obtained by the transforming means is a predetermined value or less, and changing the current supplied to the gradient magnetic field generating means and/or the magnetic field correction shim coil when the line width of the frequency-region magnetic resonance signal is more than the predetermined value.

The present invention is also realized by a magnetic resonance diagnosing apparatus wherein:

the apparatus has a static magnetic field uniformization control mode, and includes gradient magnetic field generating means, transmitter/receiver means, Fourier transforming means, discriminating means, and direct current offset changing means that are activated when the static magnetic field uniformization control mode is set;

the gradient magnetic field generating mean applies a gradient magnetic field to an object to cause a magnetic resonance phenomenon in a specific portion of the object;

the transmitter/receiver means applies an excitating RF pulse to the object in order to cause the magnetic resonance phenomenon in the specific portion of the object, and acquires a magnetic resonance signal induced from the specific portion;

the Fourier transforming means transforms the time-region magnetic resonance signal acquired by the transmitter/receiver means to a frequency-region signal;

the discriminating means discriminates whether a line width of the frequency-region signal obtained by the Fourier transforming means is a predetermined value or less; and the direct current offset changing means changes, when it is determined that the line width of the frequency-region signal obtained by the Fourier transforming means is more than the predetermined value, a direct current offset of the gradient magnetic field, supplies the direct current offset to the gradient magnetic field generating means, and instructs the gradient magnetic field generating means and the transmitter/receiver means to resume operation, and, when it is determined that the line width is the predetermined value or less, fixes the direct current offset of the gradient magnetic field, supplies the fixed direct current offset to the gradient magnetic field generating means, and stops the transmitter/receiver means and the gradient magnetic field generating means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic view showing a slice portion in which a static magnetic field is to be uniformed;

FIG. 3 is a chart showing an example of a pulse sequence for obtaining a DC offset signal in static magnetic field uniforming control;

FIGS. 7 to 11 show pulse sequences for obtaining diagnosis data and executed after the static magnetic field uniforming control, in which FIG. 7 is a chart showing a pulse sequence in accordance with a spin echo method for MRI, FIG. 8 is a chart showing a pulse sequence in accordance with a field echo method for MRI, FIG. 9 is a chart showing a pulse sequence as an example of an echo planar method for MRI, FIG. 10 is a chart showing an example of a pulse sequence for executing MRS (spectroscopy), and FIG. 11 is a chart showing an example of a pulse sequence for executing MRSI;

FIG. 14 is a block diagram showing an arrangement of a magnetic resonance diagnosing apparatus according to another embodiment of the present invention.

DETAILED DESCRIPTION OF THE PREFERRED EMBODIMENT

A magnetic resonance diagnosing apparatus according to an embodiment of the present invention will be described with reference to the accompanying drawings.

Figure 1:
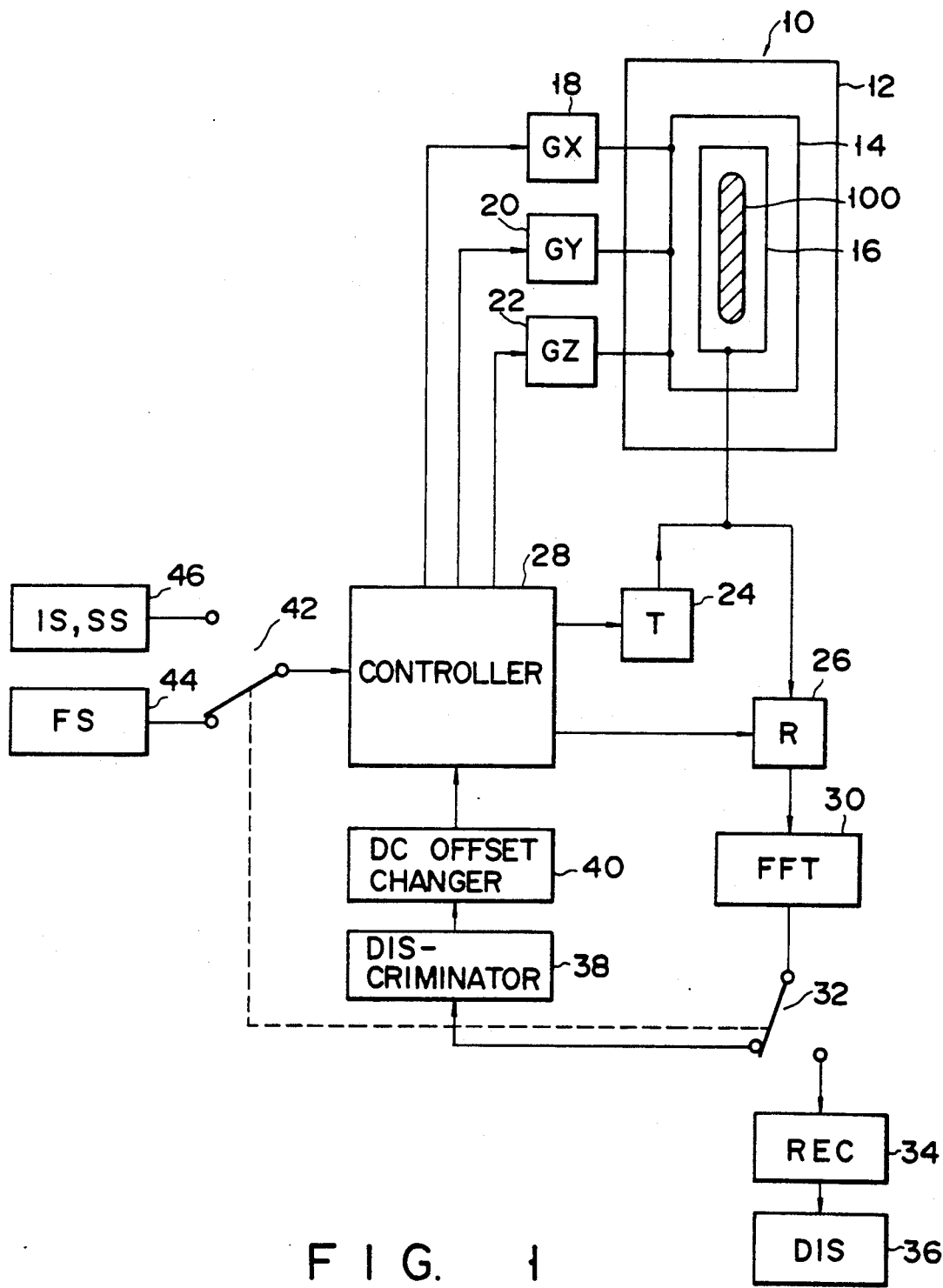
FIG. 1 is a block diagram showing a preferred example of a magnetic resonance diagnosing apparatus according to the present invention.

Referring to FIG. 1, a magnet assembly 10 can house a patient 100 and includes a normal conductive or superconductive static magnetic field magnet (a permanent magnet can also be used) 12, an X-, Y-, and Z-axis gradient magnetic field generating coil 14, and a probe 16. The gradient magnetic field generating coil 14 serves as a gradient magnetic field generating system for generating a gradient magnetic field used to give position data regarding the portion where a magnetic resonance signal is induced. The probe 16 serves as a transmitter/receiver system for transmitting an exciting RF pulse and receiving an induced magnetic resonance signal (MR signal: an echo signal or an FDI signal) and is constituted by a transmitter coil and a receiver coil.

The apparatus also has X-, Y-, and Z-axis gradient magnetic field power sources (GX, GY, and GZ) 18, 20, and 22, a transmitter (T) 24, and a receiver (R) 26. The power sources 18, 20, and 22 serve as a gradient magnetic field generating system to control excitation of the field generating coil 14. The transmitter 24 serves as a transmitter system to control transmission of the RF pulse. The receiver 26 serves as a receiver system to control reception of the induced MR signal. A controller 28 is also provided to control the power sources 18, 20, and 22, the transmitter 24, and the receiver 26.

The controller 28 activates and controls the gradient magnetic field power sources 18, 20, and 22, the transmitter 24, and the receiver 26 in accordance with a predetermined pulse sequence. Then, an RF pulse and gradient magnetic fields GX, GY, and GZ are applied to the patient based on a method such as two-dimensional Fourier transformation. When the two-dimensional Fourier transformation is adopted an arbitrary combination of the gradient magnetic fields GX, GY, and GZ are applied to the patient as a slice gradient magnetic field (GS), a phase encoding gradient magnetic field (GE), and a read gradient magnetic field (GR). As a result, excitation is performed, and then an MR signal induced from the excited portion is acquired by the probe 16.

The apparatus also has a Fourier transformer (FFT) 30 which executes two-dimensional Fourier transformation. The Fourier transformer 30 processes a large number of data obtained by the receiver 26 in accordance with Fourier transformation. An output from the Fourier transformer 30 is supplied to a reconstruction unit (REC) 34 through a switch 32 to reconstruct a slice image (two-dimensional image) or a three-dimensional image, which is then displayed on a display (DIS) 36.

The output from the Fourier transformer 30 is also supplied to a discriminator 38 through the switch 32. The discriminator 38 discriminates whether the line width of the signal which is subjected to Fourier transformation only once by the Fourier transformer 30 (a frequency-region MR signal) is more than a predetermined value or not. A single Fourier transformation is to transform a time-region signal to a frequency-region signal.

An output from the discriminator 38 is supplied to a DC (direct current) offset changer 40. Namely, when it is determined that the line width of the frequency-region MR signal is more than the predetermined value, the DC offset changer 40 supplies a DC offset, which has been changed with respect to the DC offset of the gradient magnetic field, to the gradient magnetic field power sources 18, 20 and 22 through the controller 28, thereby instructing the gradient magnetic field generating system and the transmitter/receiver system to resume operation.

When it is determined that the line width of the above-mentioned signal is the predetermined value or less, the DC offset changer 40 fixes the DC offset of the gradient magnetic fields and supplies the fixed DC offset to the gradient magnetic field generating system, thereby stopping the operation of the transmitter/receiver system and the gradient magnetic field generating system.

The controller 28 is also connected to a control system 44 or 46 through a switch 42. The control system 44 executes a sequence FS for static magnetic field uniformity control (a pulse sequence which is shown in detail in FIGS. 3 and 13 to be described later). The control system 46 executes a sequence IS for MRI (a pulse sequence which is shown in detail in FIGS. 7, 8, and 9 to be described later) or a sequence SS for MRS (a pulse sequence which is shown in detail in FIGS. 10 and 11 to be described later). The switch 42 performs the switching operation in an interlocked manner with the switch 32.

The operation of this embodiment having the above-described arrangement will be described. This embodiment aims at uniforming the static magnetic field with respect to a slice portion S1 of the patient 100. The switches 32 and 42 are set as shown in FIG. 1 in order to obtain a magnetic resonance signal from the slice portion S1, and a pulse sequence shown in FIG. 3 which is obtained by modifying a so-called spin echo method (SE method) is executed. This pulse sequence is obtained by removing the phase encoding gradient magnetic field (GE) and the read gradient magnetic field (GR from the spin echo method (SE method). In this state, it is assumed that the DC offset of the Z-axis gradient magnetic field GZ is $GZ_0$, that of the Y-axis gradient magnetic field GY is $GY_0$, and that of the X-axis gradient magnetic field GX is $GX_0$.

When the pulse sequence shown in FIG. 3 is executed, an MR signal (echo signal) is obtained from the receiver 26. The time-region MR signal is subjected to Fourier transformation by the Fourier transformer 30, and the obtained the frequency-region MR signal is supplied to the discriminator 38 through the switch 32. In this case, the line width $\pi$ of the frequency-region MR signal which is at $\epsilon\%$ from the peak is measured. When the duration $\pi$ is the predetermined value or less, the gradient magnetic field DC offset at this time is deemed to be capable of uniforming the static magnetic field at a high precision and is fixed. In this case, is preferably 50 to 80. When $\epsilon$ is within this range, the static magnetic field can be uniformed at a high precision.

On the other hand, when the line width $\pi$ is more than the predetermined value, the gradient magnetic field DC offset at this time cannot uniform the static magnetic field at a high precision. Therefore, the DC offset changed by the DC offset changer 40 is set and is supplied to the gradient magnetic field power sources 18, 20, and 22 through the controller 28.

Figure 4:
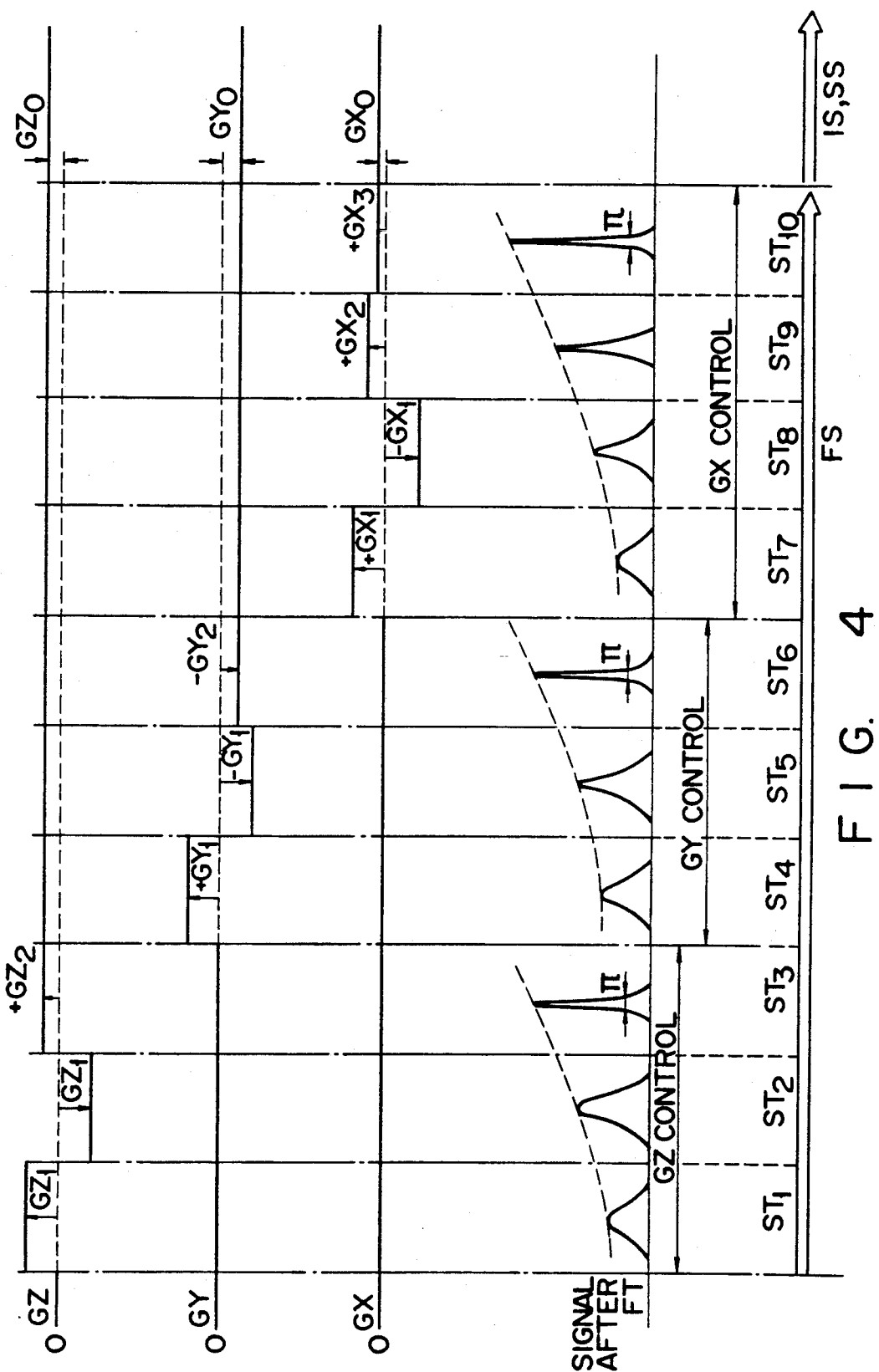
FIG. 4 is a chart showing a first example of a pulse sequence for static magnetic field uniforming control.

Control for the static magnetic field uniformization described above is executed in accordance with the sequence shown in FIG. 4. More specifically, the Z-axis gradient magnetic field DC offset is set as $GZ_0$ in first to third stages $ST_1$ to $ST_3$, the Y-axis gradient magnetic field DC offset is set as $GY_0$ in fourth to sixth stages $ST_4$ to $ST_6$, and the X-axis gradient magnetic field DC offset is s, as $GX_0$ in seventh to tenth stages $ST_7$ to $ST_{10}$. For example, in DC offset control of the Z-axis gradient magnetic field, the DC offset is set at $+GZ_1$ in the first stage $ST_1$ and the pulse sequence shown in FIG. 3 is executed. In this case, it is determined that the line width is more than the predetermined value. The DC offset is changed to $-GZ_1$ in the second stage ST2 and the pulse sequence shown in FIG. 3 is executed. In this case, it is determined again that the line width $\pi$ is more than the predetermined value. The DC offset is changed to $+GZ_2$ ($GZ_2=GZ_1/2$) in the third stage $ST_3$ and the pulse sequence shown in FIG. 3 is executed. In this case, it is determined that the line width $\pi$ is the predetermined value or less, and the DC offset of the Z-axis gradient magnetic field is fixed and set as $GZ_0$.

Y- and X-axis gradient magnetic field D offset control is performed in the same manner, and the DC offsets of the X-, Y-, and Z-axis gradient magnetic fields GX, GY, and GZ are fixed and set. Thereafter, the control system 46 for executing the MRI sequence IS or the MRS sequence SS is activated and a series of procedures for MRI or MRS is executed. As a result, high-precision MRI or MRS is obtained with respect to the slice portion S1 of FIG. 2.

Figure 5:
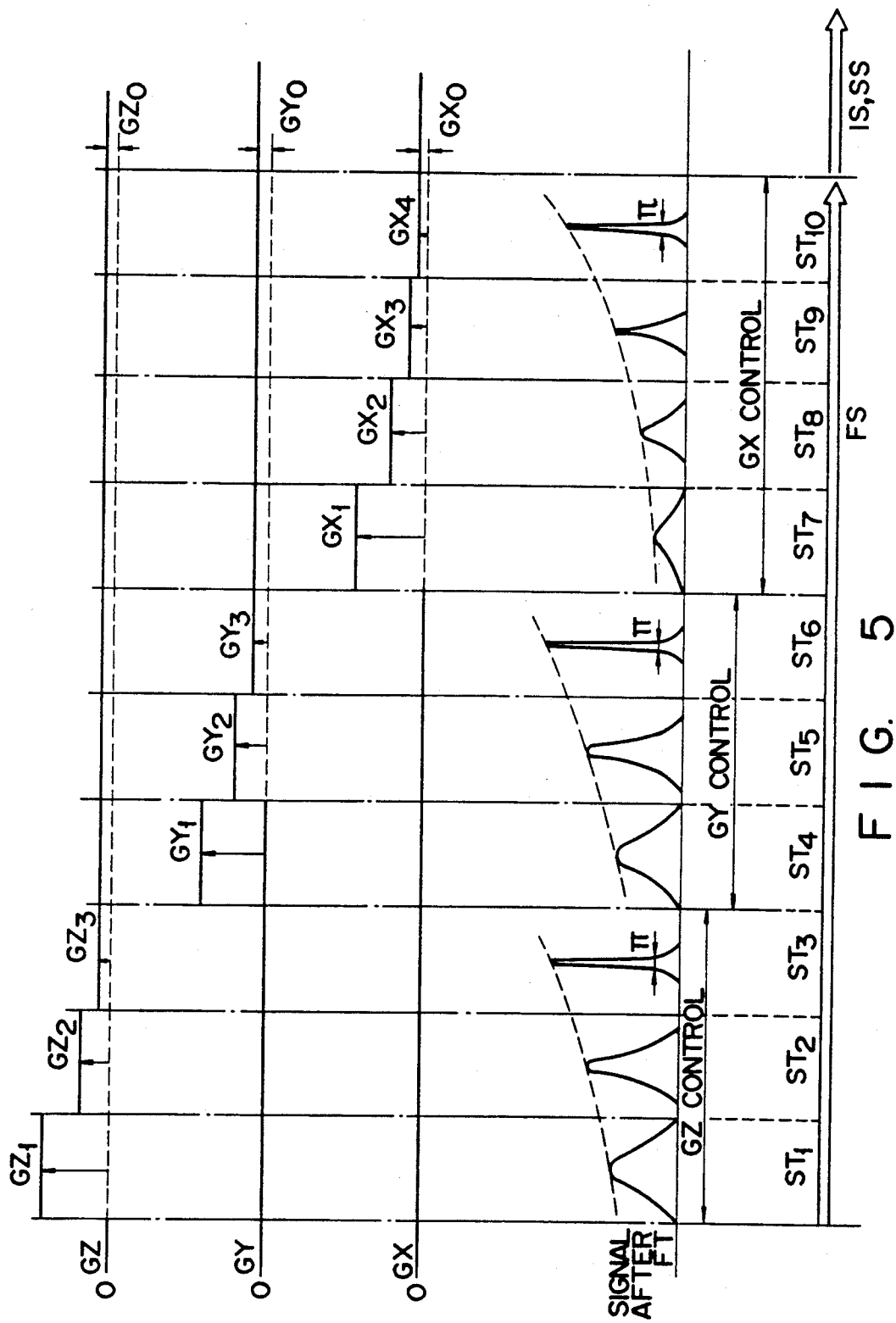
FIG. 5 is a chart showing a second example of a pulse sequence for static magnetic field uniforming control.
Figure 6:
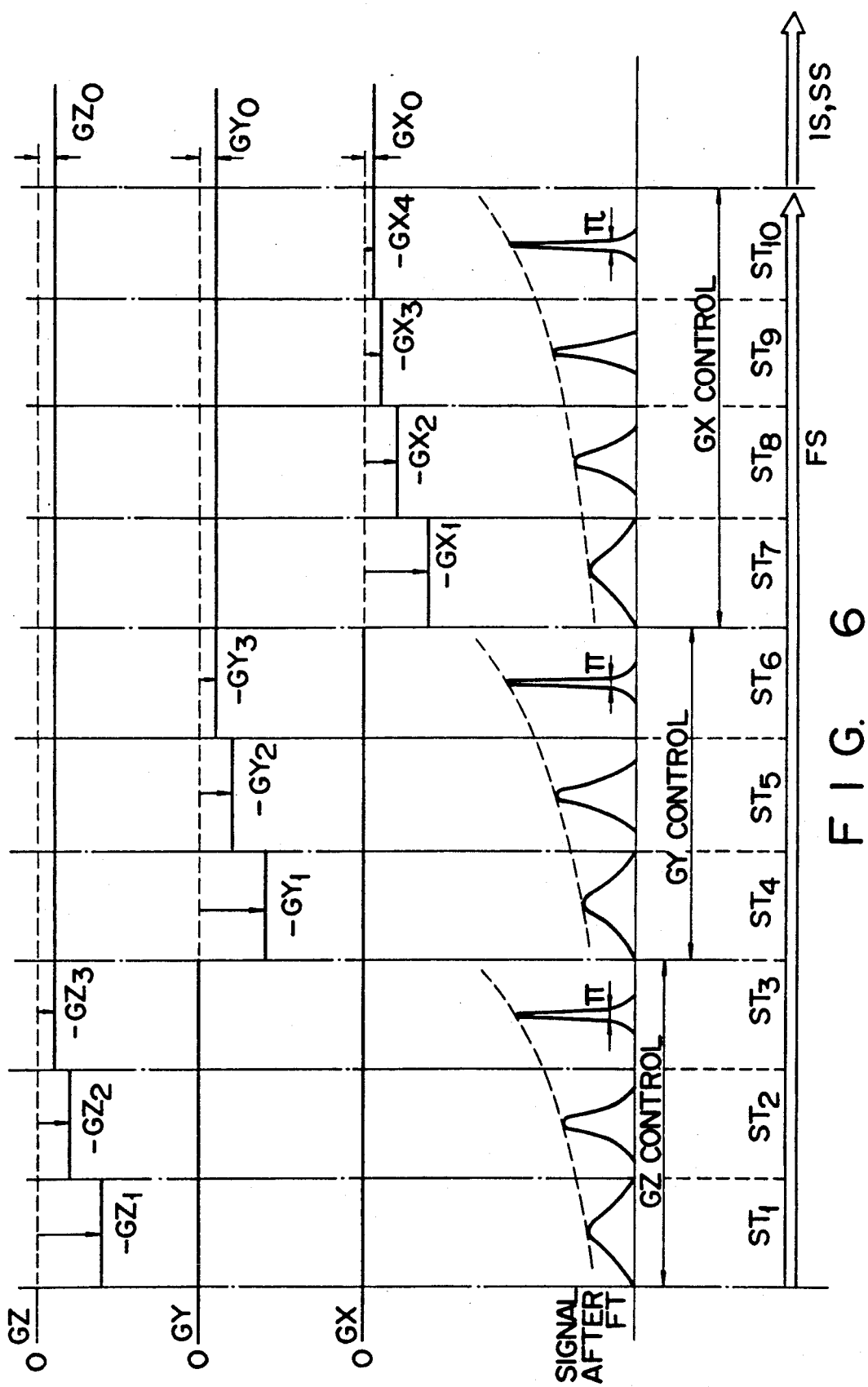
FIG. 6 is a chart showing a third example of a pulse sequence for static magnetic field uniforming control.

In DC offset control described above, an offset value is changed largely in both the positive and negative directions first, and then an offset having an intermediate value is employed. With this control method, the number of stages can be reduced. Another method can also be adopted. For example, the offset can be reduced as the stage proceeds, as shown in FIG. 5. Alternatively, the offset can be increased as the stage proceeds, as shown in FIG. 6. Any method can be adopted as far as the stages are sequentially executed such that the line width of the frequency-region MR signal of the echo signal converges.

Figure 7:
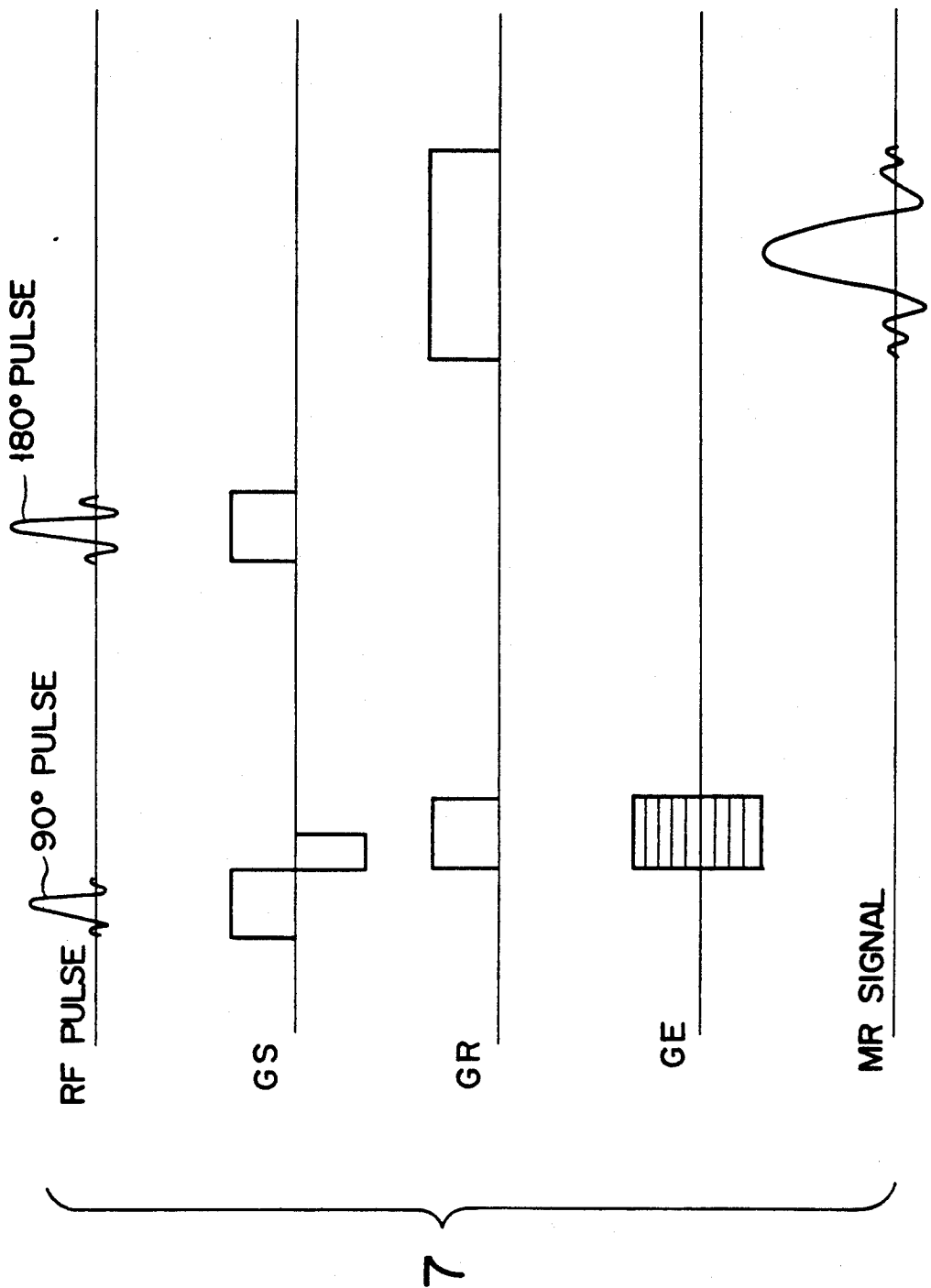
Figure 8:
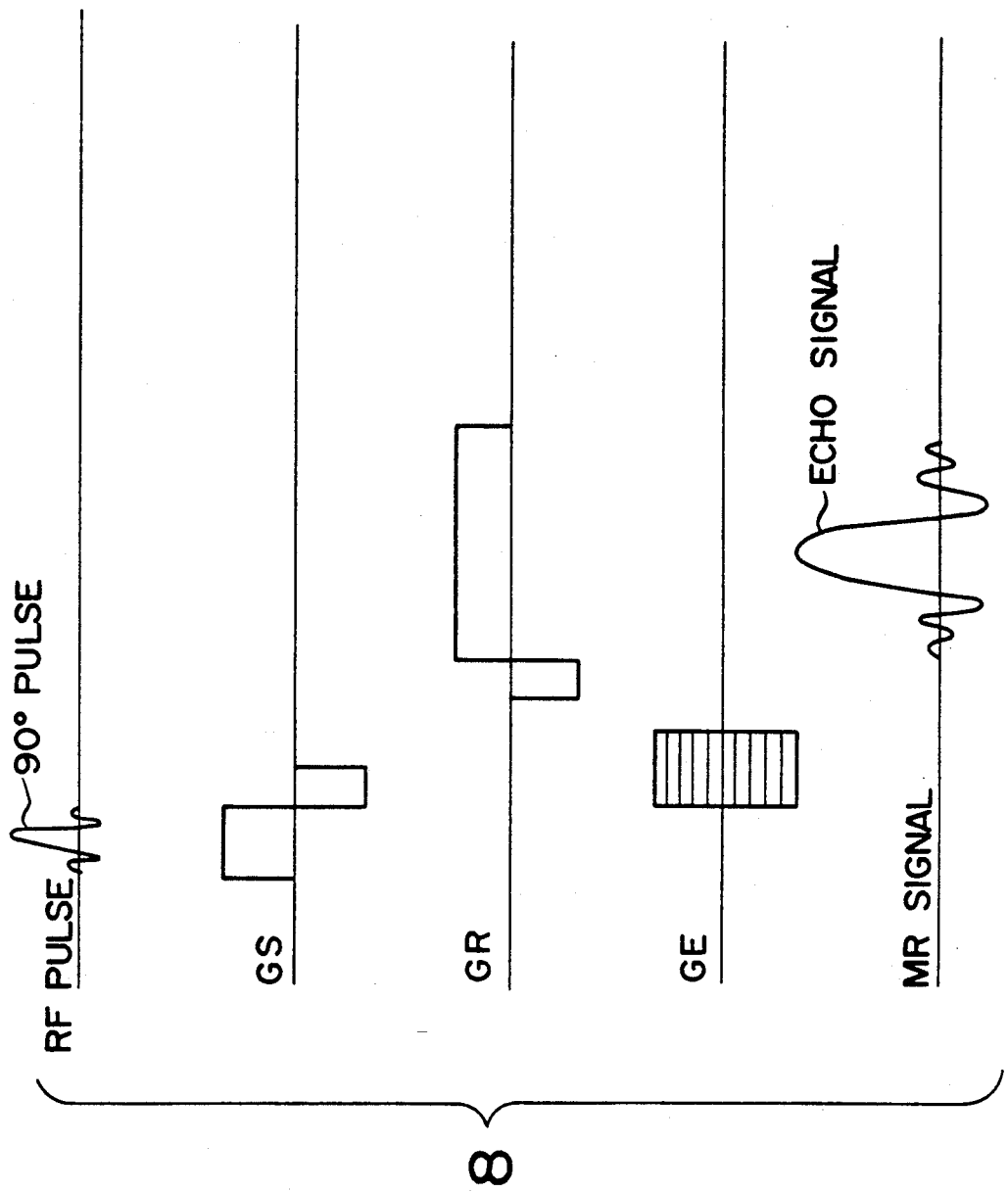

The sequence IS for MRI is shown in FIGS. 7, 8, and 9. FIG. 7 is a timing chart showing the pulse sequence of the spin echo method. FIG. 8 is a timing chart showing the pulse sequence of the field echo method that enables data acquirement at a higher speed than the spin echo method. FIG. 9 is a timing chart showing an example of a pulse sequence of the echo planar method that enables ultra-high-speed data acquisition.

Figure 10:
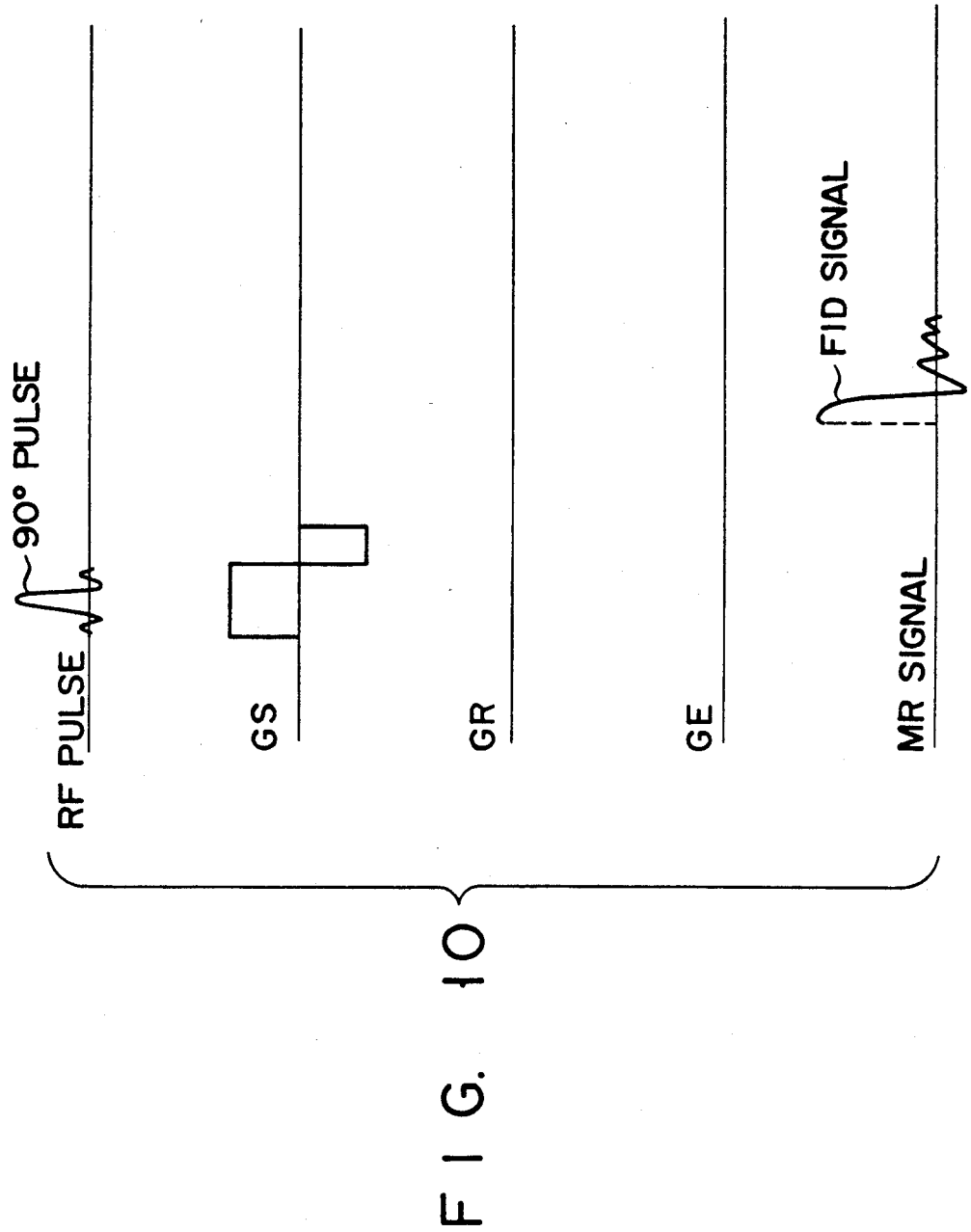
Figure 11:
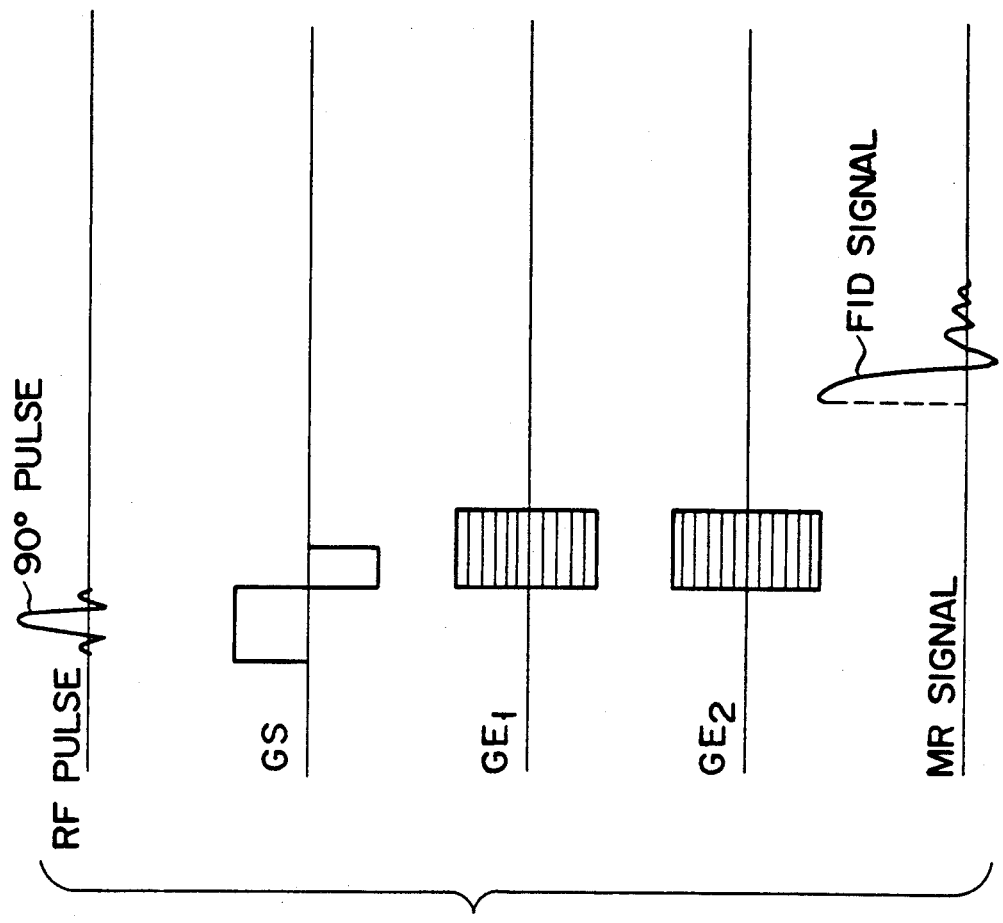

The sequence SS for MRS is shown in FIGS. 10 and 11. FIG. 10 is a timing chart showing an example of a pulse sequence for obtaining a spectroscopy (MRS). FIG. 11 is a timing chart showing an example of a pulse sequence for obtaining a spectroscopic image (MRSI).

Figure 12:
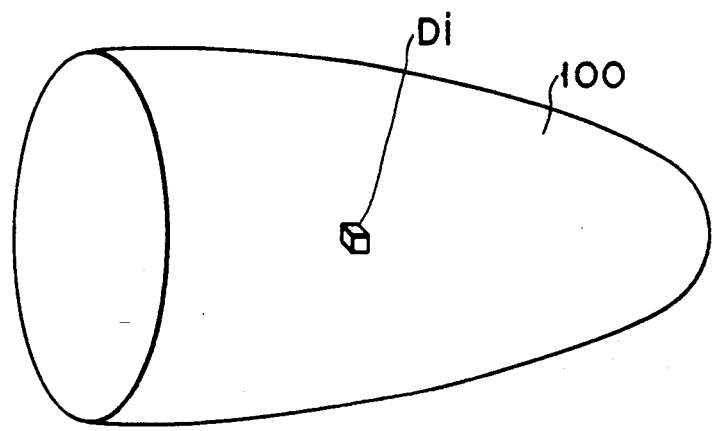
FIG. 12 is a schematic view showing a small cubic portion of a patient in which a static magnetic field is to be uniformed.
Figure 13:
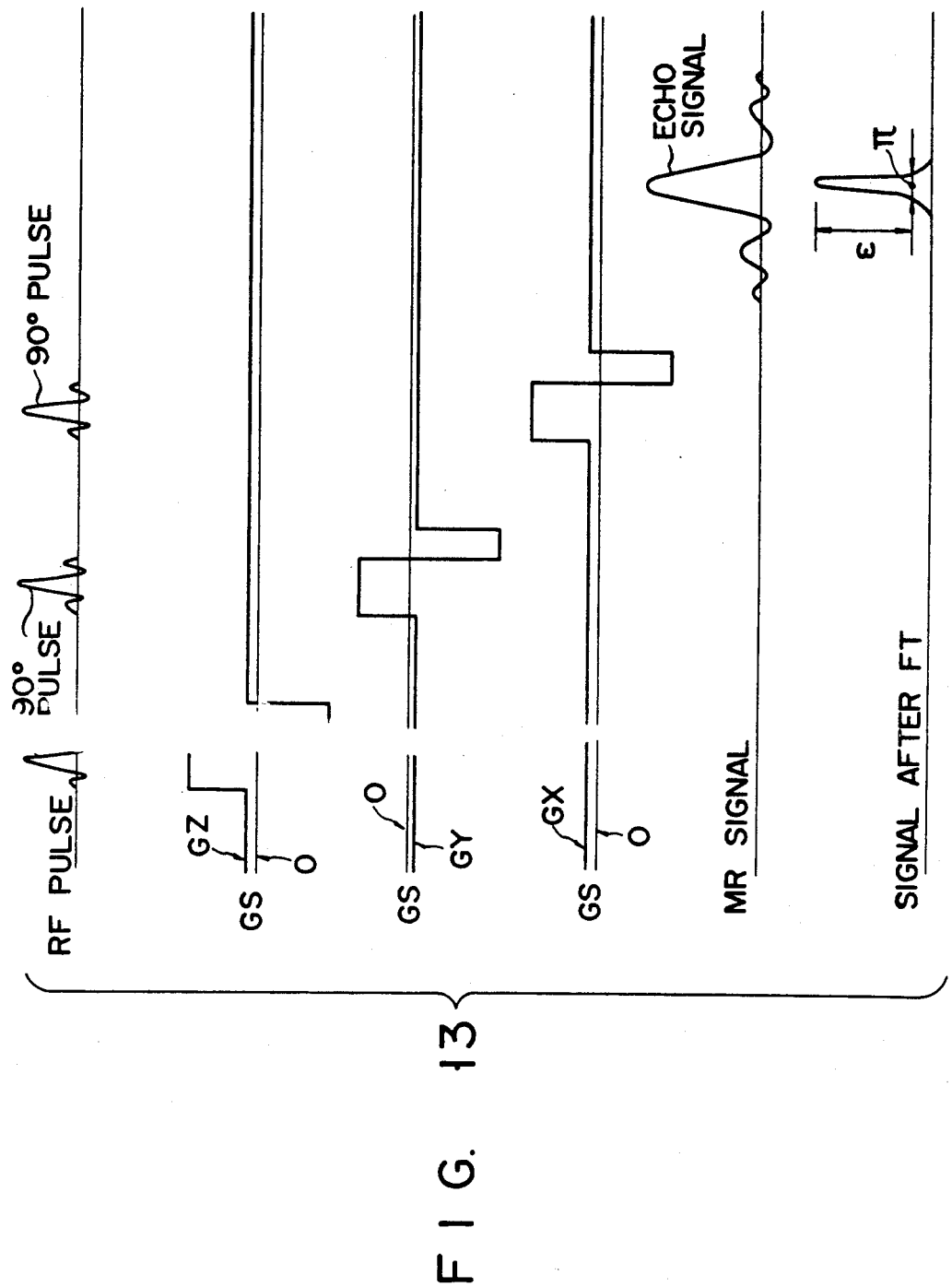
FIG. 13 is a chart showing another example of a pulse sequence for obtaining a DC offset signal in static magnetic field uniforming control.

The above embodiment exemplifies the method for uniforming the static magnetic field that aims at high-precision MRI or MRS measurement with respect to the slice portion S1 of the patient 100, as shown in FIG. 2. When MRS is to be performed, generally, signal acquisition is performed with respect to a cubic target portion Di. In this case, a so-called STE (stimulus echo) method shown in FIG. 13 is employed as the sequence for offset signal acquirement, and the procedures shown in FIG. 4, 5, or 6 are executed with respect to the cubic target portion Di of the patient 100 shown in FIG. 12.

In the above embodiment, the offset signal acquirement sequence utilizes the SE and STE methods. However, the present invention is not limited to them.

In the above embodiment, the gradient magnetic field of the area a the target of data acquirement is corrected, thereby uniforming the magnetic field. However, when at least one shim coil 48 is provided in the magnet assembly 10, as shown in FIG. 14, an offset signal is supplied to a shim power source (SS) 50 from the controller 28, in addition to the offset correction of the gradient magnetic field shown in FIG. 1, and the static magnetic field is directly corrected.

Of course, when the shim coil 48 is provided in the magnet assembly 10, such as shown in FIG. 14, an offset signal is supplied to the shim power source (SS) 50 from the controller 28, and the static magnetic field is directly corrected. In this case, the offset correction of the gradient magnetic field shown in FIG. 1, 14 should be non-operated.

As described above, according to the present invention, there is provided a magnetic resonance diagnosing apparatus that can uniform a static magnetic field at a high precision. There is also provided a magnetic resonance diagnosing apparatus that can perform MRI or MRS under a static magnetic field which is uniformed at a high precision.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetic resonance diagnosing apparatus comprising:
    a magnet system including static magnetic field generating means, gradient magnetic field generating means, exciting RF pulse generating means, magnetic resonance signal detecting means, and at least one static magnetic field correction shim coil;
    control means for controlling said static magnetic field generating means, said gradient magnetic field generating means, said exciting RF pulse generating means, and said magnetic resonance signal detecting means and the static magnetic field correction shim coil of said magnet system to obtain magnetic resonance diagnosis data;
    transforming means for transforming a magnetic resonance signal obtained by said magnetic resonance signal detecting means from a time-region signal to a frequency-region signal; and
    offset control means for fixing a offset-current supplied to said static magnetic field correction shim coil when a line width of the frequency-region magnetic resonance signal obtained by said transforming means is not more than a predetermined value, and changing the offset-current supplied to said static magnetic field correction shim coil when the line width of the frequency-region magnetic resonance signal is more than the predetermined value.

2. An apparatus according to claim 1, wherein said control means executes a pulse sequence for obtaining a magnetic resonance imaging and/or magnetic resonance spectroscopy.

3. An apparatus according to claim 2, wherein the pulse sequence for obtaining the magnetic resonance imaging and/or magnetic resonance spectroscopy is one of a spin echo method, a field echo method, and an echo planar method.

4. An apparatus according to claim 2, wherein the pulse sequence for obtaining the magnetic resonance spectroscopy is a pulse sequence for obtaining a magnetic resonance spectroscopic image.

5. An apparatus according to claim 1, wherein said transforming means transforms the time-region magnetic resonance signal detected from a desired slice of an object to a frequency-region signal.

6. An apparatus according to claim 1, wherein said transforming means transforms the time-region magnetic resonance signal detected from a desired cubic target region of an object to a frequency-region signal.

7. An apparatus according to claim 1, wherein said transforming means comprises a Fourier transformer.

8. An apparatus according to claim 1, wherein said transforming means transforms the magnetic resonance signal in accordance with Fourier transformation.

9. An apparatus according to claim 1, wherein said offset control means is operated every time a direct current offset is to be changed.

10. An apparatus according to claim 9, wherein said offset control means changes a direct current offset to large positive and negative values upon each operation.

11. An apparatus according to claim 9, wherein said offset control means gradually changes the direct current offset to a smaller value upon each operation.

12. An apparatus according to claim 9, wherein said offset control means gradually changes the direct current offset to a larger value upon each operation.

13. An apparatus according to claim 1, wherein said offset control means is operated prior to said control means.

14. A magnetic resonance diagnosing apparatus comprising:
    a magnet system including static magnetic field generating means, gradient magnetic field generating means, exciting RF pulse generating means, magnetic resonance signal detecting means, and at least one static magnetic field correction shim coil;
    control means for controlling said static magnetic field generating means, said gradient magnetic field generating means, said exciting RF pulse generating means, and said magnetic resonance signal detecting means and the static magnetic field correction shim coil of said magnet system to obtain magnetic resonance diagnosis data;
    transforming means for transforming a magnetic resonance signal obtained by said magnetic resonance signal detecting means from a time-region signal to a frequency-region signal; and
    offset control means for fixing a offset-current supplied to said static magnetic field correction shim coil when a line width of the frequency-region magnetic resonance signal obtained by said transforming means is not more than a predetermined value, and changing the offset-current supplied to said static magnetic field correction shim coil when the line width of the frequency-region magnetic resonance signal is more than the predetermined value.

15. An apparatus according to claim 14, wherein said control means executes a pulse sequence for obtaining a magnetic resonance imaging and/or magnetic resonance spectroscopy.

16. An apparatus according to claim 15, wherein the pulse sequence for obtaining the magnetic resonance imaging and/or magnetic resonance spectroscopy is one of a spin echo method, a field echo method, and an echo planar method.

17. An apparatus according to claim 15, wherein the pulse sequence for obtaining the magnetic resonance spectroscopy is a pulse sequence for obtaining a magnetic resonance spectroscopic image.

18. An apparatus according to claim 14, wherein said transforming means transforms the time-region magnetic resonance signal detected from a desired slice of an object to a frequency-region signal.

19. An apparatus according to claim 14, wherein said transforming means transforms the time-region magnetic resonance signal detected from a desired cubic target region of an object to a frequency-region signal.

20. An apparatus according to claim 14, wherein said transforming means comprises a Fourier transformer.

21. An apparatus according to claim 14, wherein said transforming means transforms the magnetic resonance signal in accordance with Fourier transformation.

22. An apparatus according to claim 14, wherein said offset control means is operated every time a direct current offset is to be changed.

23. An apparatus according to claim 22, wherein said offset control means changes a direct current offset to large positive and negative values upon each operation.

24. An apparatus according to claim 22, wherein said offset control means gradually changes the direct current offset to a smaller value upon each operation.

25. An apparatus according to claim 22, wherein said offset control means gradually changes the direct current offset to a larger value upon each operation.

26. An apparatus according to claim 14, wherein said offset control means is operated prior to said control means.

27. A magnetic resonance diagnosing apparatus comprising:
a magnet system including static magnetic field generating means, gradient magnetic field generating means, exciting RF pulse generating means, magnetic resonance signal detecting means, and at least one static magnetic field correction shim coil;
control means for controlling said static magnetic field generating means, said gradient magnetic field generating means, said exciting RF pulse generating means, and said static magnetic resonance signal detecting means and the static magnetic field correction shim coil of said magnet system to obtain magnetic resonance diagnosis data;
transforming means for transforming a magnetic resonance signal obtained by said magnetic resonance signal detecting means from a time-region signal to a frequency-region signal; and
offset control means for fixing a offset-current supplied to said static magnetic field correction shim coil when a line width of the frequency-region magnetic resonance signal obtained by said transforming means is not more than a predetermined value, and changing the offset-current supplied to said static magnetic field correction shim coil when the line width of the frequency-region magnetic resonance signal is more than the predetermined value.

28. An apparatus according to claim 27, wherein said transforming means transforms the time-region magnetic resonance signal detected from a desired slice of an object to a frequency-region signal.

29. An apparatus according to claim 27, wherein said transforming means transforms the time-region magnetic resonance signal detected from a desired cubic target region of an object to a frequency-region signal.

30. An apparatus according to claim 27, wherein said offset control means is operated every time a direct current offset is to be changed.

31. An apparatus according to claim 27, wherein said offset control means is operated prior to said control means.

32. A magnetic resonance diagnosing apparatus wherein:
said apparatus has a static magnetic field uniformization control mode, and includes gradient magnetic field generating means, transmitter/receiver means, Fourier transforming means, discriminating means, and direct current offset changing means that are activated when the static magnetic field uniformization control mode is set;
said gradient magnetic field generating means applies a gradient magnetic field to an object to cause a magnetic resonance phenomenon in a specific portion of the object;
said transmitter/receiver means applies an exciting RF pulse to the object in order to cause the magnetic resonance phenomenon in the specific portion of the object, and acquires a magnetic resonance signal induced from the specific portion;
said Fourier transforming means transforms the time-region magnetic resonance signal acquired by said transmitter/receiver means to a frequency-region signal in accordance with Fourier transformation;
said discriminating means discriminates whether a line width of the frequency-region magnetic resonance signal obtained by said Fourier transforming means is not more than a predetermined value; and
said direct current offset changing means changes, when it is determined that the line width of the frequency-region magnetic resonance signal obtained by said Fourier transforming means is more than the predetermined value, a direct current offset of the gradient magnetic field, supplies the direct current offset to said gradient magnetic field generating means, and instructs said gradient magnetic field generating means and said transmitter/receiver means to resume operation, and, when it is determined that the line width is not more than the predetermined value, fixes the direct current offset of said gradient magnetic field, supplied the fixed direct current offset to said gradient magnetic field generating means, and stops said transmitter/receiver means and said gradient magnetic field generating means.

33. An apparatus according to claim 32, wherein one of a control mode for imaging or spectroscopy acquirement and a mode for static magnetic field uniformization control can be exclusively selected.

34. An apparatus according to claim 7, wherein said transforming means transforms the magnetic resonance signal in accordance with Fourier transformation.

35. An apparatus according to claim 20, wherein said transforming means transforms the magnetic resonance signal in accordance with Fourier transformation.

* * * * *